United States Patent
Park et al.

(10) Patent No.: US 7,101,752 B2
(45) Date of Patent: Sep. 5, 2006

(54) SEMICONDUCTOR PROCESS FOR REMOVING DEFECTS DUE TO EDGE CHIPS OF A SEMICONDUCTOR WAFER AND SEMICONDUCTOR DEVICE FABRICATED THEREBY

(75) Inventors: Jeong-Hun Park, Gyeonggi-do (KR); Hee-Sun Chae, Gyeonggi-do (KR); Kyoung-Shin Park, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 238 days.

(21) Appl. No.: 10/809,076

(22) Filed: Mar. 24, 2004

(65) Prior Publication Data
US 2004/0191927 A1    Sep. 30, 2004

(30) Foreign Application Priority Data
Mar. 24, 2003  (KR)  .................. 10-2003-0018274

(51) Int. Cl.
*H01L 21/8242*    (2006.01)
(52) U.S. Cl. ..................... 438/239; 438/254
(58) Field of Classification Search ............... 438/239, 438/254
See application file for complete search history.

(56) References Cited

U.S. PATENT DOCUMENTS

2002/0187598 A1*  12/2002  Park et al. .................. 438/197

* cited by examiner

*Primary Examiner*—David S. Blum
(74) *Attorney, Agent, or Firm*—Marger Johnson & McCollom, P.C.

(57) ABSTRACT

A method for removing defects due to edge chips of a semiconductor wafer is disclosed. This method includes forming a molding layer over a semiconductor wafer. The molding layer is patterned to form a plurality of storage node holes, where the plurality of storage node holes include at least one first storage node hole formed on an effective chip area and at least one second storage node hole formed on an edge chip area. First storage nodes and second storage nodes are formed in the first and second storage node holes, respectively. A photoresist pattern is formed on the wafer having the storage nodes. The photoresist pattern is preferably formed to expose the effective chip areas and to cover the edge chip areas. The molding layer is etched, using the photoresist pattern as an etching mask, to expose portions of the first storage nodes.

13 Claims, 9 Drawing Sheets

SEMICONDUCTOR PROCESS FOR REMOVING DEFECTS DUE TO EDGE CHIPS OF A SEMICONDUCTOR WAFER AND SEMICONDUCTOR DEVICE FABRICATED THEREBY

This application claims priority from Korean Patent Application No. 2003-18274, filed on Mar. 24, 2003, the contents of which are incorporated herein by reference in their entirety.

BACKGROUND OF THE INVENTION

1. Field of the Invention

This invention relates to a process for manufacturing a semiconductor device and, more particularly, to a semiconductor process for removing defects due to edge chips of a semiconductor wafer and semiconductor device fabricated thereby.

2. Description of the Related Art

Most semiconductor chips are formed in a circle-shaped semiconductor wafer. Therefore, the semiconductor chips located at the edge of the semiconductor wafer may have abnormal patterns. This is due to a defocus or the like that occurs during a photolithography process for forming predetermined patterns in the edge of the semiconductor wafer.

FIGS. 1 through 6 are cross-sectional views illustrating a conventional semiconductor process for forming DRAM devices on a semiconductor wafer. In the drawings, reference characters "A" and "B" represent a main chip area formed in an inside region of the semiconductor wafer and an edge chip area formed in an edge of the semiconductor wafer, respectively.

Referring to FIG. 1, an interlayer dielectric layer 3 and an etch stop layer 7 are sequentially formed on a semiconductor wafer 1. The etch stop layer 7 and the interlayer dielectric layer 3 are patterned to form main chip buried contact holes in the main chip area A and edge chip buried contact holes in the edge chip area B. Main chip buried contact plugs 5a and edge chip buried contact plugs 5b are formed in the main chip buried contact holes and in the edge chip buried contact holes, respectively. A molding layer such as a molding oxide layer 9 is formed on an entire surface of the semiconductor wafer 1 having the buried contact plugs 5a and 5b. A photoresist layer 11 is coated on the molding oxide layer 9. As illustrated in FIG. 1, the photoresist layer 11 has a non-uniform thickness throughout the wafer 1. In other words, the photoresist layer over the edge region of the wafer 1 may be formed to be thicker than the photoresist layer over the inside region of the wafer 1.

Subsequently, the photoresist layer 11 over the edge of the wafer 1 is selectively exposed and removed to expose the molding oxide layer 9 in the edge of the wafer 1. The edge exposure process is for preventing a clamp that contacts with the edge of the wafer from being contaminated by the photoresist layer during a subsequent dry etching process. The exposed edge molding oxide layer has a width of We. Preferably, the width We is minimized to increase the number of effective chips formed at the wafer 1. Therefore, although the photoresist layer 11 over the edge of the wafer 1 is selectively removed, the remaining photoresist layer 11 over the wafer 1 may be still non uniform.

The remaining photoresist layer is then exposed and developed using a storage node mask. Consequently, first storage node openings 11a and second storage node openings 11b are formed in the main chip area A and in the edge chip area B respectively. The first storage node openings 11a exhibit normal profiles that expose the molding oxide layer 9 in the main chip area A, whereas the second storage node openings 11b exhibit abnormal profiles that do not expose the molding oxide layer 9 in the edge chip area B. This phenomenon is due to the uneven thickness of the photoresist layer as described above. In other words, the exposure process with the storage node mask is performed within a predetermined focus latitude that is suitable for the uniform thickness of the photoresist layer 11 in the main chip area A. Accordingly, it is difficult to optimize the focus latitude of light irradiated onto the edge chip area B. As a result, defocus occurs in the edge chip area B and the second storage node openings 11b show abnormal profiles. In addition, the defocus phenomenon in the edge chip area B may be due to the uneven surface profiles on the edge of the wafer 1, especially, on a bevel region of the wafer 1.

Referring to FIG. 2, the molding oxide layer 9 and the etch stop layer 7 are etched using the photoresist layer 11 having the first storage node openings 11a and the second storage node openings 11b as an etch mask. As a result, first storage node holes 13a exposing the main chip buried contact plugs 5a are formed in the main chip area A. However, second storage node holes 13b having abnormal profiles are formed in the edge chip area B. As shown in FIG. 2, the second storage node holes 13b do not expose the edge chip buried contact plugs 5b. This is due to the abnormal profiles of the second storage node openings 11b. The photoresist layer 11 is then removed.

Referring to FIG. 3, a polysilicon layer and a sacrificial layer formed of a material such as oxide are sequentially formed on an entire surface of the semiconductor wafer 1 having the first and second storage node holes 13a and 13b. The polysilicon layer is conformally formed, and the sacrificial oxide layer is formed to a sufficient thickness to fill the first and second storage node holes 13a and 13b. The polysilicon layer and the sacrificial oxide layer are etched back until a top surface of the molding oxide layer 9 is exposed. As a result, first cylindrical storage nodes 15a are respectively formed in the first storage node holes 13a, and second cylindrical storage nodes 15b are respectively formed in the second storage node holes 13b. Further, sacrificial oxide layer patterns 17 remain in the first and second storage nodes 15a and 15b. As shown in FIG. 3, the second storage nodes 15b adjacent to the edge of the wafer 1 are not in contact with the edge chip buried contact plugs 5b.

Referring to FIG. 4, the molding oxide layer 9 and the sacrificial oxide layer patterns 17 are removed using a wet etching process. Accordingly, inner walls and outer sidewalls of the first and second storage nodes 15a and 15b are exposed. The second storage nodes 15b adjacent to the edge of the wafer 1 may be lifted during the wet etching process for removing the molding oxide layer 9 and the sacrificial oxide layer patterns 17. The second storage nodes 15b, which are lifted from the surface of the wafer, are adhered onto the surface of the main chip area A, thereby acting as particle sources.

Referring to FIG. 5, a dielectric layer 19 and a plate conductive layer are sequentially formed over the semiconductor wafer 1 where the molding oxide layer 9 and the sacrificial oxide layer patterns 17 are removed. The plate conductive layer and the dielectric layer 19 are patterned to form a first plate electrode 21a and a second plate electrode 21b that cover a cell array area in the main chip area A and a cell array area in the edge chip area B, respectively. Consequently, as shown in FIG. 5, the cell array area adjacent to the edge of the wafer 1 has a relatively low surface profile as compared to a normal cell array area (cell array area in the main chip area A). In other words, there exists a step difference H between a top surface of the plate electrode (21a of FIG. 5) in the normal cell array area and a top surface of the plate electrode (21b of FIG. 5) in the abnormal cell array area. An upper interlayer dielectric layer 23 is formed over the semiconductor wafer having the first plate electrode 21a and the second plate electrode 21b. The upper interlayer dielectric layer 23 is generally formed of a flowable oxide layer such as a BPSG (boro-phosphor-silicate glass) layer. Nevertheless, the upper interlayer dielectric layer 23 also has an uneven surface profile, which is due to the step difference H.

Referring to FIG. 6, the uneven surface profile of the upper interlayer dielectric layer 23 may lead to a difficulty in a subsequent photolithography process. Accordingly, there is a need to planarize the upper interlayer dielectric layer 23 using a planarization process such as a chemical mechanical polishing (hereinafter, referred to as "CMP") process. However, when the upper interlayer dielectric layer 23 having the uneven surface is planarized using the CMP process, an upper corner C of the plate electrode in the normal cell array area adjacent to the abnormal cell array area may be exposed as shown in FIG. 6.

As discussed above, the storage nodes in the cell array area that is adjacent to the edge of the wafer may be lifted during a subsequent wet etching process. The storage nodes, which are lifted, are adhered onto the normal main chip area, thereby acting as particle sources.

Accordingly, the manufacturing yield of semiconductor devices is significantly reduced. Moreover, the abnormal area where the storage nodes are lifted has a lower surface than the normal cell array area. Thus, the storage nodes in the normal cell array area may be exposed during a subsequent planarization process.

SUMMARY OF THE INVENTION

The semiconductor processes include forming a molding layer on a semiconductor wafer. The molding layer is patterned to form first storage node holes and second storage node holes. The first storage node holes are formed in a plurality of effective chip areas which are defined in an inside area of the wafer, and the second storage node holes are formed in a plurality of edge chip areas which are defined in an edge of the wafer. First and second storage nodes are formed in the first and second storage node holes respectively. A photoresist pattern is formed on a predetermined area of the wafer having the storage nodes. The photoresist pattern covers portions of the edge chip areas. The molding layer in the effective chip areas is selectively etched using the photoresist pattern as an etching mask, thereby exposing portions of the first storage nodes.

DETAILED DESCRIPTION OF PREFERRED EMBODIMENTS

Figure 1:
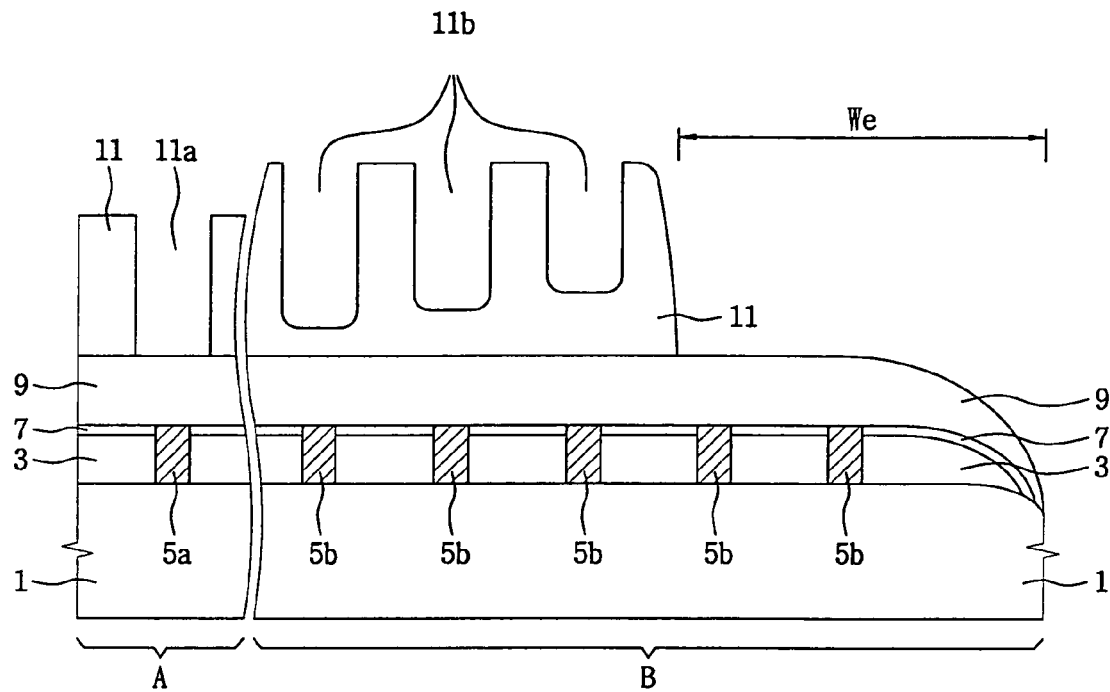
FIGS. 1 through 6 are cross-sectional views for illustrating a conventional semiconductor process.
Figure 2:
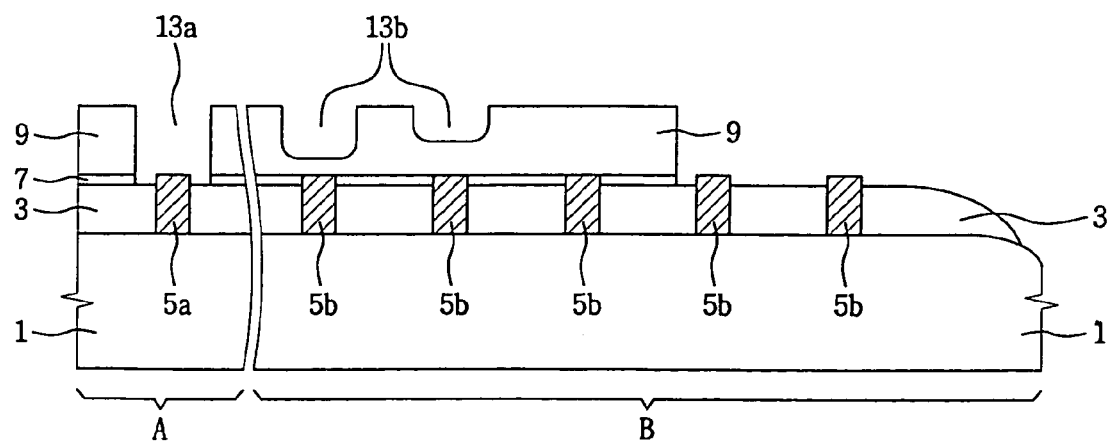
Figure 3:
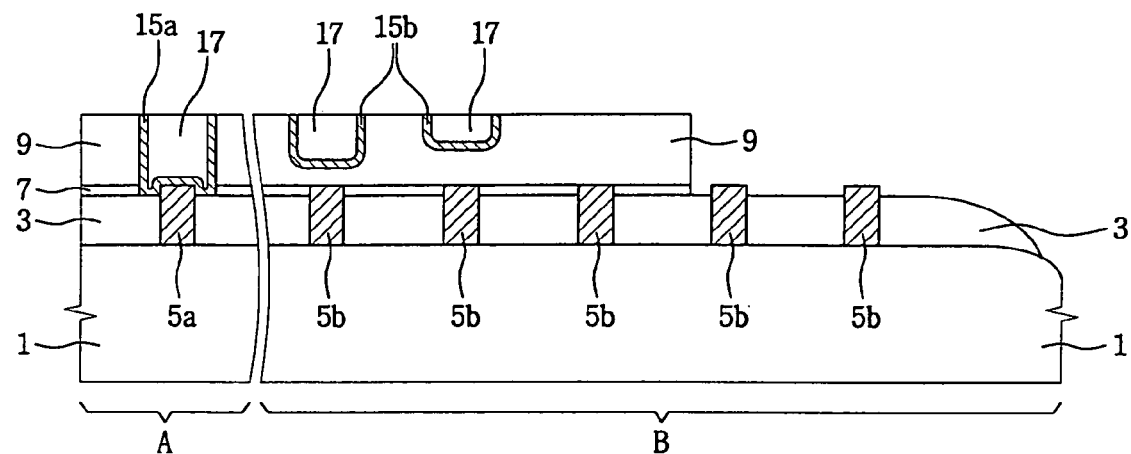
Figure 4:
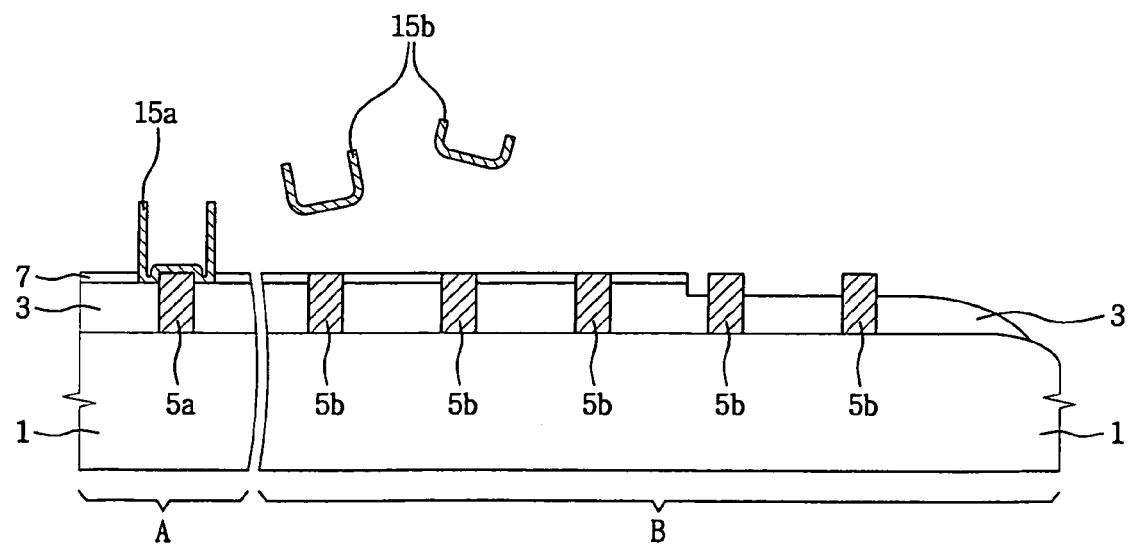
Figure 5:
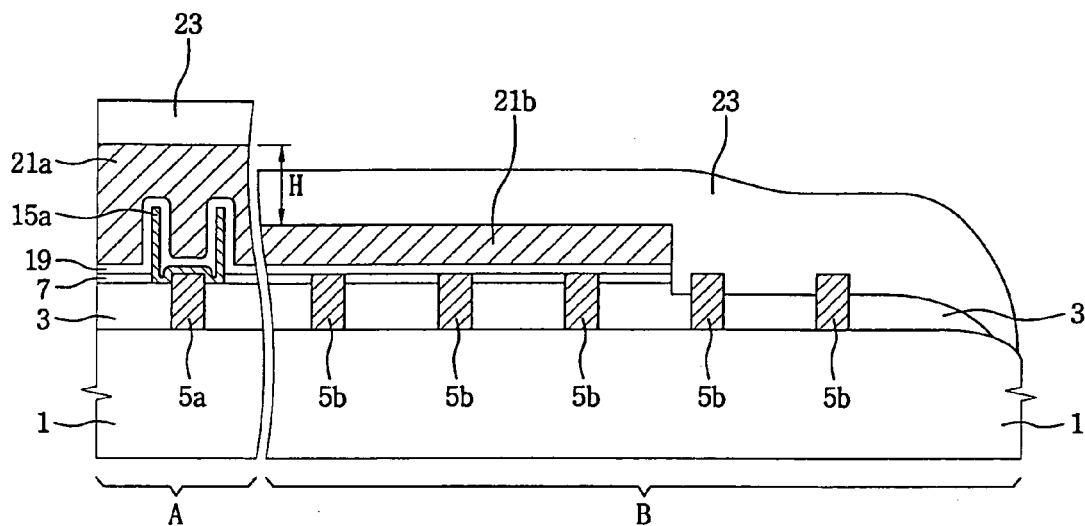
Figure 6:
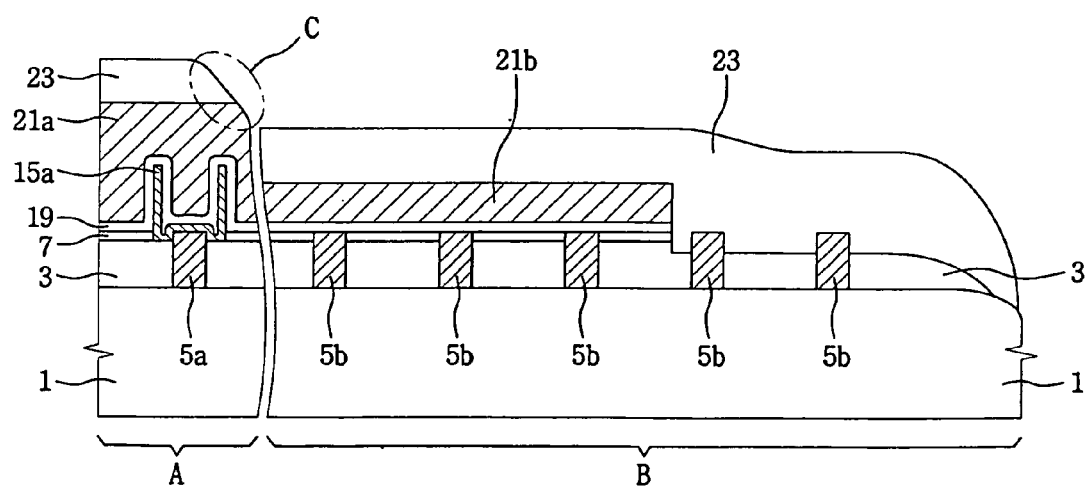
Figure 7:
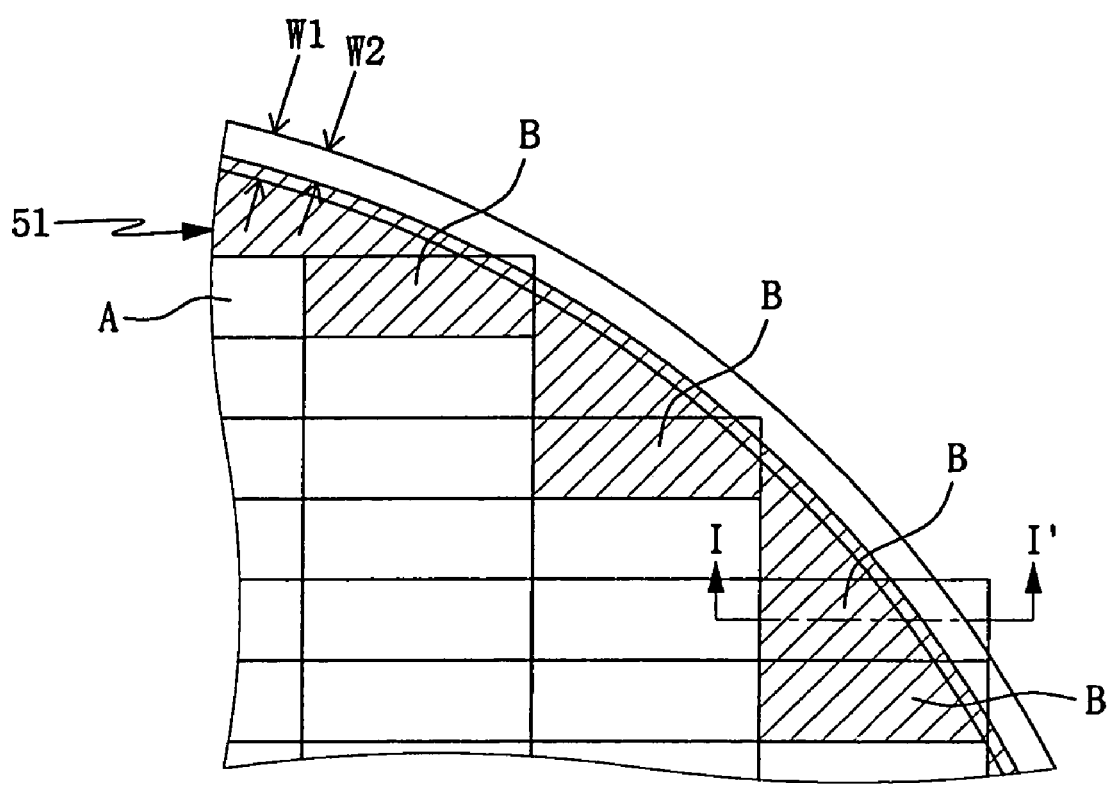
FIG. 7 is a top plan view for illustrating semiconductor processes according to embodiments of this disclosure.

This disclosure will now describe embodiments of the invention more fully hereinafter with reference to the accompanying drawings. FIG. 7 is a top plan view to illustrate processes of fabricating semiconductor chips formed on a semiconductor wafer in accordance with embodiments of this disclosure, and FIGS. 8 through 12 are cross-sectional views taken along the line I–I' of FIG. 7. In the drawings, reference characters "A" and "B" indicate effective chip areas formed in the inside of the semiconductor wafer and the edge chip areas formed in the edge of the semiconductor wafer, respectively. Furthermore, each of the effective chip areas A comprises an effective cell array area Cm and an effective peripheral circuit area Pm surrounding the effective cell array area Cm, and each of the edge chip areas B comprises an edge cell array area Ce and an edge peripheral circuit area Pe surrounding the edge cell array area Ce. Scribe lanes S/L are interposed between the chip areas A and B.

Figure 8:
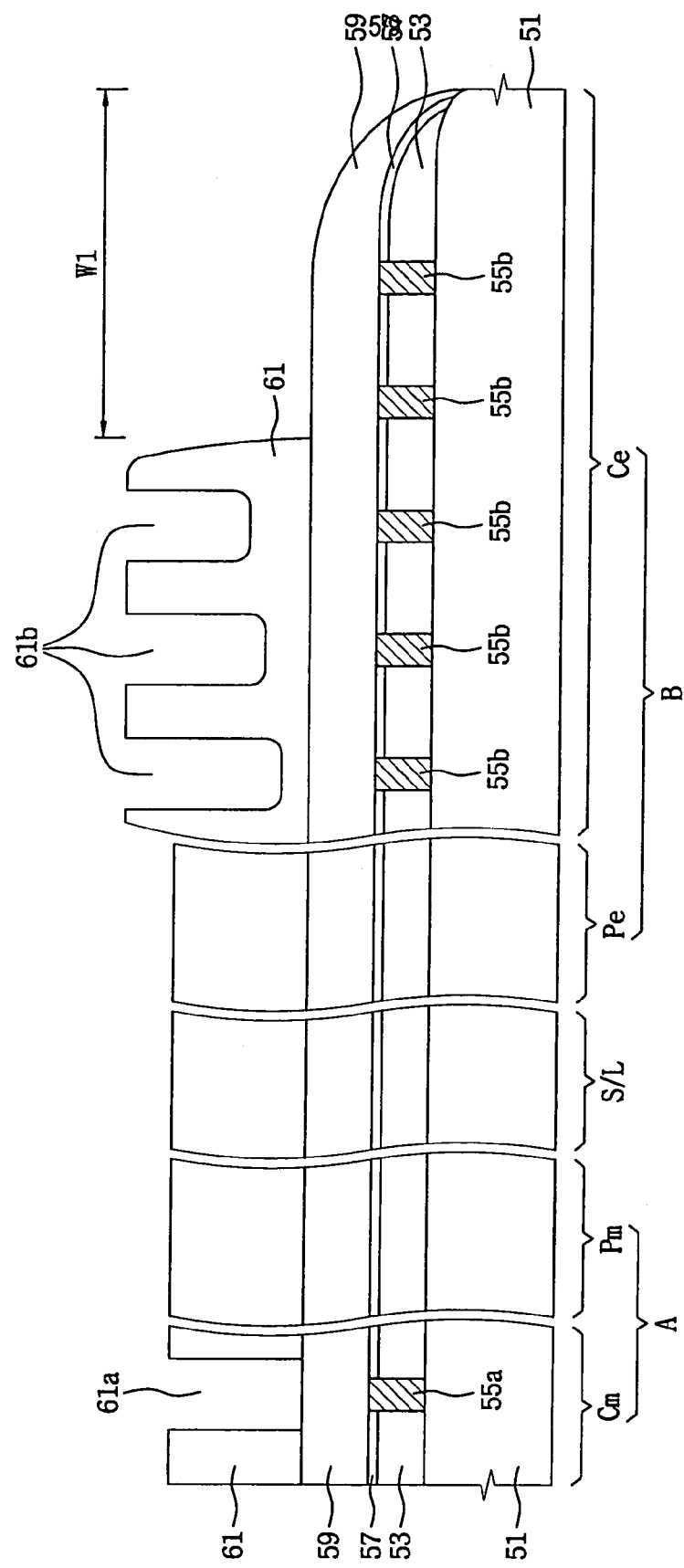
FIGS. 8 through 12 are cross-sectional views, taken along the line I–I' of FIG. 7, to illustrate semiconductor processes according to embodiments of this disclosure.

Referring to FIGS. 7 and 8, a lower interlayer dielectric layer 53 and an etch stop layer 57 are sequentially formed on the semiconductor wafer 51. It is preferable that the lower interlayer dielectric layer 53 is formed of a silicon oxide layer and the etch stop layer 57 is formed of a material layer having an etch selectivity with respect to the lower interlayer dielectric layer 53. For example, the etch stop layer 57 may be formed of a silicon nitride layer. The etch stop layer 57 and the lower interlayer dielectric layer 53 are patterned to form buried contact holes in the respective cell array areas Cm and Ce. The buried contact holes expose predetermined areas of the semiconductor wafer 1. When semiconductor devices formed in the chip areas A and B are DRAM devices, the buried contact holes expose source areas of access transistors in the DRAM cells. Buried contact plugs are formed in the buried contact holes. The buried contact plugs comprise first buried contact plugs 55a formed in the effective cell array areas Cm and second buried contact plugs 55b formed in the edge cell array areas Ce.

A molding layer such as a molding oxide layer 59 is formed on the semiconductor wafer 51 having the buried contact plugs 55a and 55b. The molding oxide layer 59 is preferably formed of a material layer having an etch selectivity with respect to the etch stop layer 57. For example, the molding oxide layer 59 may be formed of a chemical vapor deposition (CVD) oxide layer. A first photoresist layer 61 is coated on the molding oxide layer 59. The first photoresist layer 61 generally has an uneven thickness throughout the wafer 51. In detail, the first photoresist layer 61 on the edge of the wafer 51 may be thicker than the first photoresist layer 61 on the inside region of the wafer 51. The photoresist layer 61 on the edge of the wafer 51 is selectively exposed and developed to expose the edge of the molding oxide layer 59. The edge exposure area has a first width of W1. It is desirable that the first width W1 has a minimum value within an allowed range in order to increase the number of the effective chip areas A. Removing the first photoresist layer 61 on the edge of the wafer 51 is for preventing a clamp which fixes the wafer 51 during a subsequent dry etching process from being contaminated by the photoresist layer 61. Nevertheless, the first photoresist layer 61 adjacent to the edge exposure area may be still thicker than the first photoresist layer 61 in the inside region of the wafer 51.

The first photoresist layer 61 that remains after the edge exposure process is patterned using a storage node mask to form storage node openings. The storage node openings comprise first storage node openings 61a formed in the effective cell array areas Cm and second storage node openings 61b formed in the edge cell array areas Ce. In this case, the first storage node openings 61a exhibit a normal profile that exposes the molding oxide layer 59, whereas the second node openings 61b, especially, the second node openings 61b adjacent to the edge exposure area, exhibit an abnormal profile that does not expose the molding oxide layer 59. This is due to a defocus that is caused by a non-uniform thickness of the first photoresist layer 61. In addition, the defocus may also be due to the uneven surface profile of the edge of the wafer 51, that is, a bevel region of the wafer 51.

Figure 9:
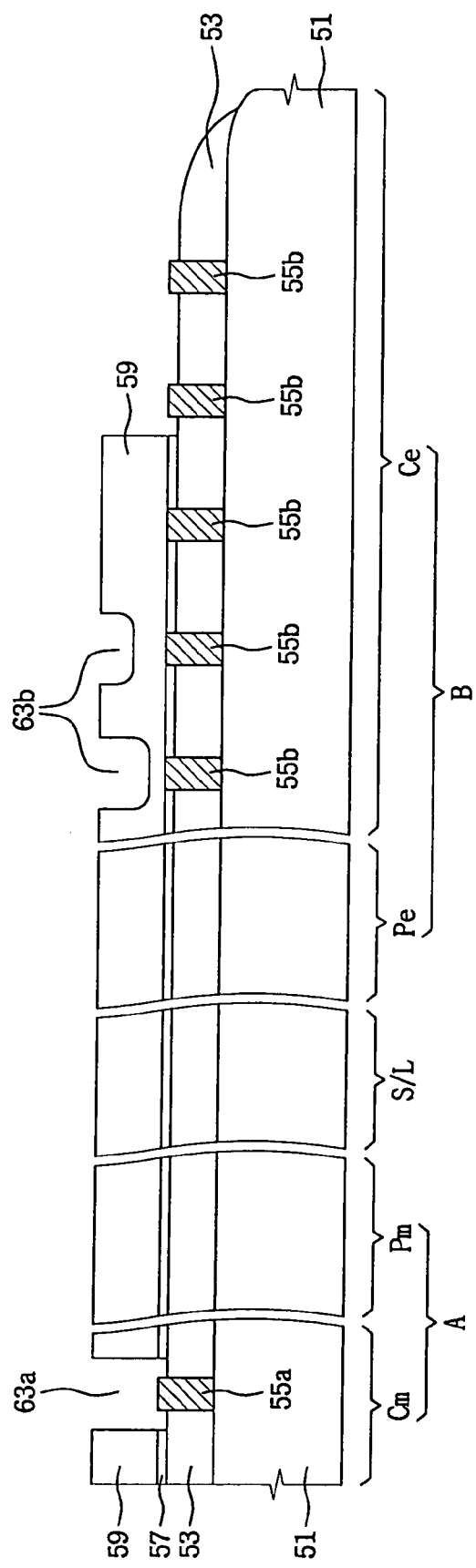

Referring to FIGS. 7 and 9, the molding oxide layer 59 and the etch stop layer 57 are etched using the photoresist layer 61 having the first and second storage node openings 61a and 61b as an etch mask, thereby forming first and second storage node holes 63a and 63b in the effective cell array areas Cm and in the edge cell array areas Ce, respectively. The first storage node holes 63a may show a normal profile that exposes the first buried contact plugs 55a, whereas the second storage node holes 63b may show an abnormal profile that does not expose the second buried contact plugs 55b, as illustrated in FIG. 9. The first photoresist layer 61 is then removed.

Figure 10:
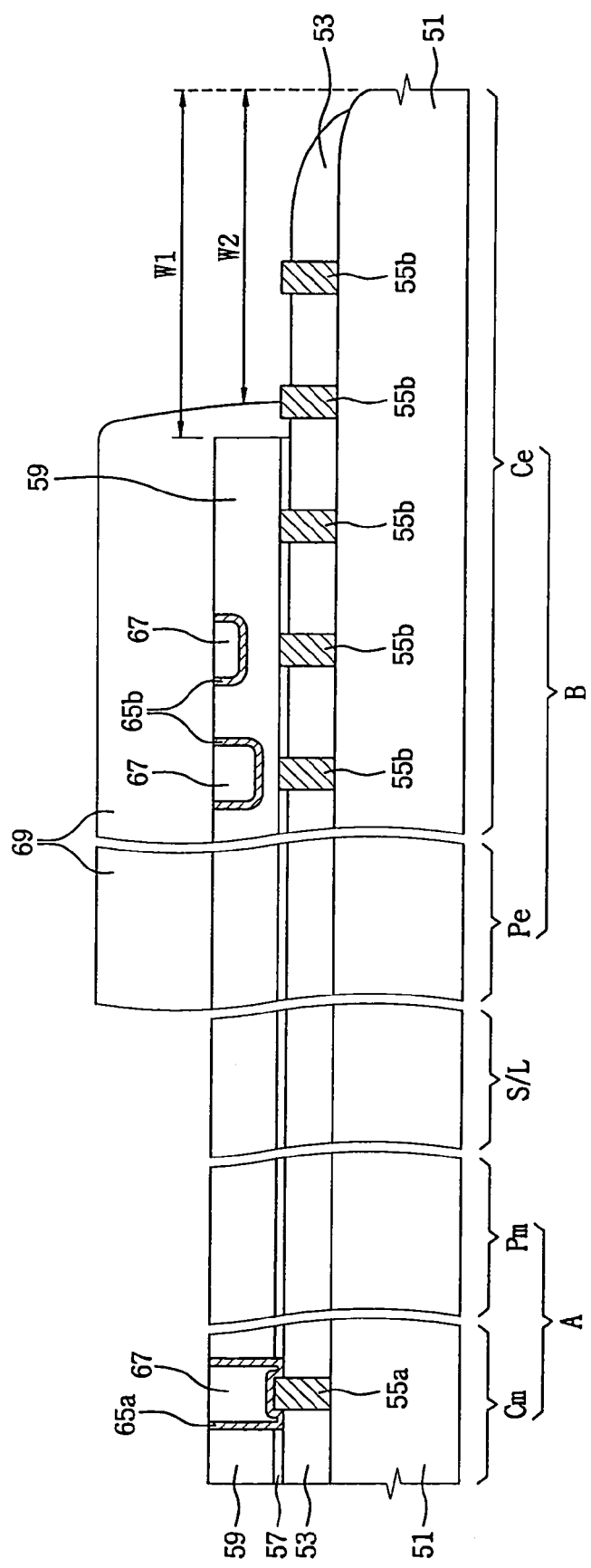

Referring to FIGS. 7 and 10, a storage node conductive layer is conformally formed on a surface of the wafer having the first and second storage node holes 63a and 63b. The storage node conductive layer may comprise a doped polysilicon layer. Subsequently, a sacrificial oxide layer that fills the first and second storage node holes 63a and 63b is formed on the storage node conductive layer. The sacrificial oxide layer and the storage node conductive layer are etched back until a top surface of the molding oxide layer 59 is exposed, thereby forming a first cylindrical storage nodes 65a in the first storage node holes 63a and a second cylindrical storage nodes 65b in the second storage node holes 63b. As a result, sacrificial layer patterns 67 may remain in the first and second cylindrical storage nodes 65a and 65b.

Alternatively, the storage node conductive layer may be formed to completely fill the first and second storage node holes 63a and 63b. In this case, the formation process of the sacrificial oxide layer is omitted, and first and second box-shaped storage nodes are formed in the first and second storage node holes 63a and 63b, respectively.

The first storage nodes 65a are normally formed to be in contact with the first buried contact plugs 55a. On the contrary, the second storage nodes 65b may be spaced apart from the second buried contact plugs 55b by the molding oxide layer 59, as shown in FIG. 10.

A second photoresist layer is formed on the semiconductor wafer having the first and second storage nodes 65a and 65b. The second photoresist layer is patterned using a blank mask to form a second photoresist pattern 69 that only exposes the effective chip area A. As a result, the second photoresist pattern 69 covers the edge chip area B. Further, the second photoresist pattern 69 may expose the scribe lane S/L. Prior to formation of the second photoresist pattern 69, the edge region of the second photoresist layer may be selectively exposed and developed to form a second edge exposure area having a second width of W2. In this case, it is preferable that the second width W2 is smaller than the first width W1.

Figure 11:
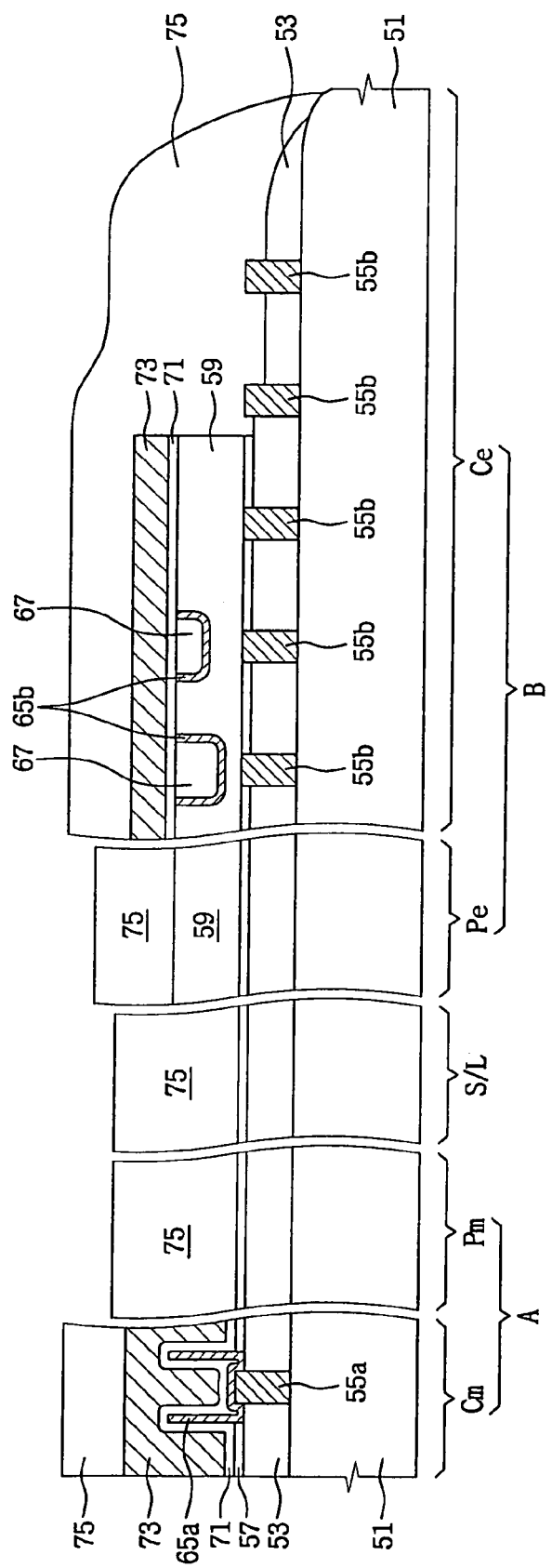

Referring to FIGS. 7 and 11, the molding oxide layer 59 and the sacrificial oxide layer patterns 67, in the effective chip area A, are selectively etched using the second photoresist pattern 69 as an etch mask, thereby exposing inner walls and outer sidewalls of the first storage nodes 65a. The molding oxide layer 59 and the sacrificial layer patterns 67 may be etched using a wet etching technique. The molding oxide layer 59 and the sacrificial oxide layer patterns 67 in the edge chip areas B are not etched because of the presence of the second photoresist pattern 69. Accordingly, the second photoresist pattern 69 prevents the second storage nodes 65b from being lifted. In addition, the surface of the edge chip area B has the same level as the top surfaces of the first storage nodes 65a in the effective chip area A. The second photoresist pattern 69 is then removed, preferably by using an ashing process.

A dielectric layer and a plate conductive layer are sequentially formed on the wafer 1, in which the second photoresist pattern 69 is removed. The plate conductive layer and the dielectric layer are patterned to form dielectric layer patterns 71 and plate electrodes 73, which are sequentially stacked. The dielectric layer patterns 71 and the plate electrodes 73 are formed to cover the effective cell array areas Cm and the edge cell array areas Ce. Therefore, the top surfaces of the plate electrodes 73 in the effective cell array areas Cm and the edge cell array areas Ce may be located at the same level.

A first upper interlayer dielectric layer is formed on the wafer having the plate electrodes 73. The first upper interlayer dielectric layer may be formed of a flowable dielectric layer such as a BPSG layer. The surface of the first upper interlayer dielectric layer may still have an uneven profile. This is due to the first storage nodes 65a in the effective cell array areas Cm and the un-etched molding oxide layer 59 in the edge cell array areas Ce. Thus, the first upper interlayer dielectric layer in the cell array areas Cm and Ce is selectively and partially etched to form a first planarized upper interlayer dielectric layer 75. Nevertheless, the first planarized upper interlayer dielectric layer 75 may still have a global step difference.

Figure 12:
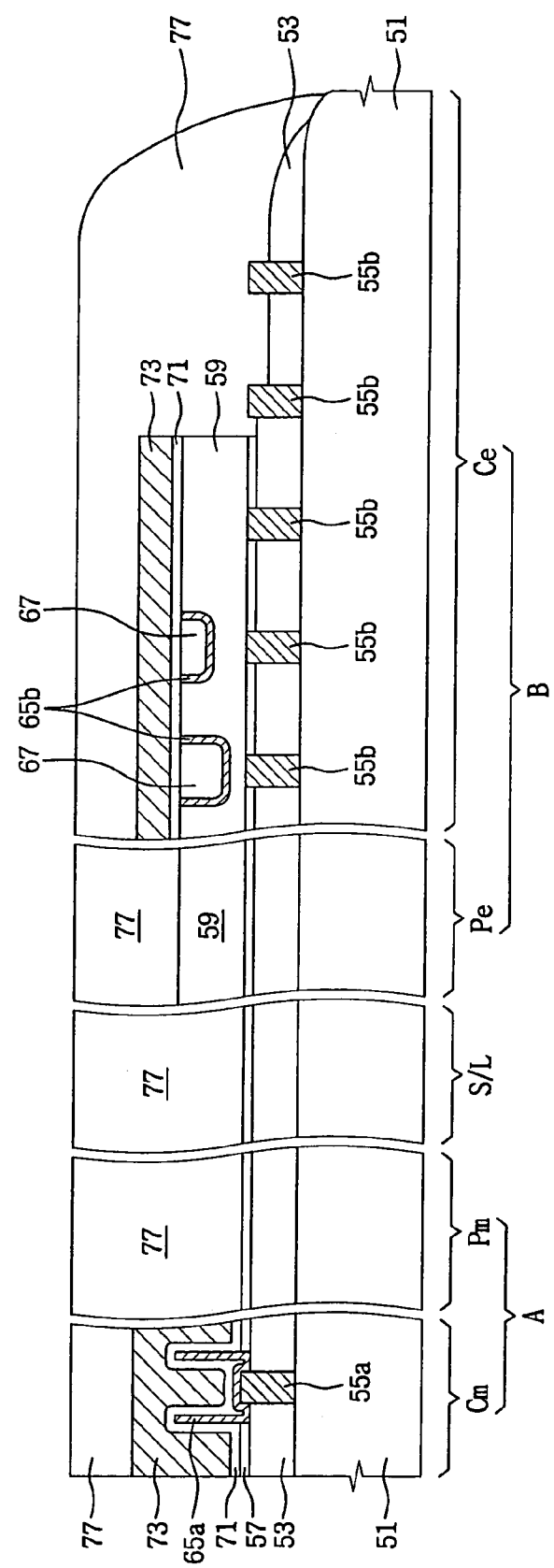

Referring to FIGS. 7 and 12, a second upper interlayer dielectric layer is formed on the first planarized upper interlayer dielectric layer 75. The second upper interlayer dielectric layer may be formed of a CVD oxide layer. The second upper interlayer dielectric layer and the first planarized upper interlayer dielectric layer 75 are planarized using a CMP process to form a fully planarized upper interlayer dielectric layer 77. As a result, the top surface of the fully planarized upper interlayer dielectric layer 77 shows a flat profile throughout the wafer 51. Accordingly, when a metal layer is formed on the fully planarized upper interlayer dielectric layer 77 and the metal layer is patterned using a photolithography process, the flat top surface of the upper interlayer dielectric layer 77 can prevent a process margin from being reduced by a defocus or an irregular reflection.

As described above, the edge chip areas adjacent to the edge of the wafer are covered with a photoresist pattern during the etching process for exposing sidewalls of the first storage nodes in the effective chip areas. As a result, the photoresist pattern can prevent the second storage nodes in the edge chip areas from being lifted, even though the second storage nodes are spaced apart from the second buried contact plugs.

While the invention has been disclosed in its preferred form, the specific embodiments thereof as disclosed and illustrated herein are not to be considered in a limiting sense. Indeed, it should be readily apparent to those skilled in the art in view that various changes in form and details may be made therein without departing from the spirit and scope of the invention as defined by the appended claims and their equivalents.

What is claimed is:

1. A method of manufacturing a semiconductor device, the method comprising:
    forming a molding layer over a semiconductor wafer;
    patterning the molding layer to form a plurality of storage node holes, wherein the plurality of storage node holes include at least one first storage node hole formed on an effective chip area and at least one second storage node hole formed on an edge chip area;
    forming first and second storage nodes in the first and second storage node holes, respectively;
    forming a photoresist pattern that covers the edge chip area; and
    selectively etching the molding layer, using the photoresist pattern as an etching mask, to expose portions of the first storage nodes.

2. The method of claim 1, wherein the photoresist pattern exposes the effective chip area.

3. The method of claim 1, wherein selectively etching the molding layer is performed after forming the photoresist pattern that covers the edge chip area.

4. The method of claim 1, further comprising:
    sequentially forming a lower interlayer dielectric layer and an etch stop layer on the semiconductor wafer prior to formation of the molding layer; and
    forming a plurality of contact plugs electrically connected to the semiconductor wafer, wherein the contact plugs include at least one first buried contact plug formed in the effective chip area, and at least one second buried contact plug formed in the edge chip area.

5. The method of claim 4, wherein the etch stop layer is formed of a material layer having an etch selectivity with respect to the lower interlayer dielectric layer and the molding layer.

6. The method of claim 5, wherein the etch stop layer comprises a silicon nitride layer.

7. The method of claim 1, wherein the first and second storage nodes have a cylindrical shape, the method further comprising:
    filling the first and second cylindrical storage nodes with sacrificial layer patterns; and
    removing the sacrificial layer patterns in the first cylindrical storage nodes when the molding layer is etched.

8. The method of claim 1, further comprising:
    removing the photoresist pattern;
    sequentially forming a dielectric layer and a plate conductive layer overlying the first and second storage nodes; and
    patterning the plate conductive layer and the dielectric layer to form plate electrodes and dielectric layer patterns.

9. The method of claim 8, further comprising:
    forming a first upper interlayer dielectric layer overlying the plate electrodes;
    partially etching the first upper interlayer dielectric layer on the plate electrodes to form a first planarized upper interlayer dielectric layer;
    forming a second upper interlayer dielectric layer on the first planarized upper interlayer dielectric layer; and
    planarizing the first and second upper interlayer dielectric layers to form a second planarized upper interlayer dielectric layer.

10. The method of claim 9, wherein the first upper interlayer dielectric layer comprises a flowable dielectric layer.

11. The method of claim 10, wherein the flowable dielectric layer comprises a borophosphosilicate glass (BPSG) layer.

12. The method of claim 9, wherein the second upper interlayer dielectric layer is formed of a chemical vapor deposition (CVD) oxide layer.

13. The method of claim 9, wherein planarizing the first and second upper interlayer dielectric layers comprises etching back.

* * * * *